United States Patent
Smeloy

(10) Patent No.: US 9,111,602 B2
(45) Date of Patent: Aug. 18, 2015

(54) ACCURATE GLOBAL REFERENCE VOLTAGE DISTRIBUTION SYSTEM WITH LOCAL REFERENCE VOLTAGES REFERRED TO LOCAL GROUND AND LOCALLY SUPPLIED VOLTAGE

(75) Inventor: Yossi Smeloy, Mizpe Kamun (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 1014 days.

(21) Appl. No.: 12/726,366

(22) Filed: Mar. 18, 2010

(65) Prior Publication Data

US 2010/0188140 A1  Jul. 29, 2010

Related U.S. Application Data

(63) Continuation-in-part of application No. 11/691,513, filed on Mar. 27, 2007, now abandoned.

(60) Provisional application No. 60/789,875, filed on Apr. 7, 2006.

(51) Int. Cl.
    *G05F 1/10*   (2006.01)
    *G05F 3/02*   (2006.01)
    *G11C 5/14*   (2006.01)

(52) U.S. Cl.
    CPC .................................... *G11C 5/147* (2013.01)

(58) Field of Classification Search
    CPC ......... G05F 1/465; G05F 3/262; G05F 3/247; G05F 3/24; G11C 5/147
    USPC .......................................... 327/538, 540, 541
    See application file for complete search history.

(56) References Cited

U.S. PATENT DOCUMENTS

| | | | |
|---|---|---|---|
| 4,926,138 A | 5/1990 | Castello | |
| 5,132,555 A * | 7/1992 | Takahashi | 326/102 |
| 5,506,541 A | 4/1996 | Herndon | |
| 5,821,807 A | 10/1998 | Brooks | |
| 5,939,867 A | 8/1999 | Capici | |
| 6,038,189 A * | 3/2000 | Morishita | 365/227 |
| 6,677,809 B2 * | 1/2004 | Perque et al. | 327/541 |
| 6,885,236 B2 | 4/2005 | Vorenkamp | |
| 6,917,187 B2 * | 7/2005 | Okubo et al. | 323/275 |
| 2002/0014914 A1 * | 2/2002 | Perque et al. | 327/543 |
| 2002/0118568 A1 * | 8/2002 | Tanzawa | 365/185.11 |
| 2003/0231051 A1 * | 12/2003 | Vorenkamp | 327/540 |
| 2004/0150451 A1 * | 8/2004 | Van Dijk et al. | 327/276 |
| 2007/0000685 A1 * | 1/2007 | Inoue | 174/255 |

* cited by examiner

*Primary Examiner* — Quan Tra
(74) *Attorney, Agent, or Firm* — Mark M. Friedman

(57) ABSTRACT

A system and method for accurately distributing a master reference voltage to a plurality of local circuits within a system. A central master reference voltage is distributed to a plurality of local circuits as a difference in the voltage of a pair of conductors oriented substantially spatially parallel. Local reference voltages are generated based on the master reference voltage and a local voltage source.

10 Claims, 3 Drawing Sheets

ACCURATE GLOBAL REFERENCE VOLTAGE DISTRIBUTION SYSTEM WITH LOCAL REFERENCE VOLTAGES REFERRED TO LOCAL GROUND AND LOCALLY SUPPLIED VOLTAGE

CROSS-REFERENCE TO RELATED APPLICATIONS

This application claims the benefit of provisional patent application (PPA) Ser. No. 60/789,875, filed Apr. 7, 2006 and priority from U.S. patent application Ser. No. 11/691,513, filed Mar. 27, 2007, by the present inventors, which are incorporated by reference.

FIELD OF THE INVENTION

The present embodiment generally relates to the field of electronic circuits, and in particular, concerns accurately distributing a master reference voltage to a plurality of local circuits within a system.

BACKGROUND OF THE INVENTION

In large circuits, it is often desirable to use a single, central, reference voltage source, in order to save area and/or save power. A single central reference voltage source is also known as a global reference voltage. In the context of this document, the term area generally refers to the area used by circuit elements. In the case of an integrated circuit (IC), area is known as real estate, and generally refers to the surface area of an integrated circuit die. A challenge in using a central reference voltage source is accurately distributing the reference voltage across relatively large distances. In the context of this document, accurate distribution refers to the value of a reference voltage at the output of a central reference voltage source being substantially equal to the value of the voltage at an input to a local reference voltage generator. Distribution can introduce voltage errors due to ground and supply voltage differences across the circuit, and stray voltages that are coupled inductively and/or capacitively to the conductors used to distribute the reference voltage.

In the context of this document, unless otherwise specified, the term "refer", when applied to voltages, means the difference between a first voltage and a second voltage. For example, if a first voltage is 2.0V referred to a second voltage, and the second voltage is 0.1 V above earth ground, the first voltage is 2.1 V above earth ground.

In the context of this document, unless otherwise specified, resistance values are given in Ohms. "k" indicates multiplication by 1000. For example, "2 k" indicates a resistance of 2000 Ohms.

In the context of this document, as is popular in the industry, conductors are also referred to as lines and the terms should be understood to be used interchangeably unless specified otherwise.

A variety of conventional techniques attempt to provide differential voltage references. U.S. Pat. No. 5,821,807 to Brooks teaches a differential voltage reference circuit implemented in CMOS that provides a continuous differential voltage having good substrate and power supply noise rejection and low power consumption. However, Brooks does not explain how the differential voltage can be used to provide a local voltage referenced to local ground or a local power supply voltage.

U.S. Pat. No. 4,926,138 to Castello et al introduces a fully differential voltage source. The voltage reference is obtained from a bandgap voltage source fed with currents proportional to the temperature, in order to minimize thermal voltage variations. However, Castello et al also does not offer a solution for distribution of the voltage source nor providing a local voltage referenced to local ground or a local power supply voltage.

U.S. Pat. No. 5,939,867 to Capici et al teaches a circuit that can generate a local voltage with respect to a single input reference voltage. The circuit of Capici et al is used for local connection and operation.

U.S. Pat. No. 6,885,236 to Vorenkamp teaches a circuit capable of generating an output voltage with respect to two voltages that differ by a reference voltage. The circuit of Vorenkamp is described as having a reference generator that generates a voltage reference. This generic voltage source directly supplies a voltage reference to a single circuit, which Vorenkamp describes in detail.

While the above-described conventional circuits can be used as components of a system for distributing a central master reference voltage to local circuits, there remains the problem of how to distribute accurately a master reference voltage to local circuits.

U.S. Pat. No. 5,506,541 to Herndon, titled Bias Voltage Distribution System, teaches a system for generating bias potentials at one main location within a logic circuit and then distributing them to other logic circuits. As is common in the art, this system is an example of sending voltages from a central source to remote circuits. While many systems generate signals at a central source and receive signals at a remote circuit, there remains the problem of how to distribute accurately a master reference voltage to local circuits There is thus a widely recognized need for, and would be highly advantageous to have, a system and method for distributing accurately a single central master reference voltage to a plurality of local circuits. It is further desirable to be able to generate a local reference voltage based on the master reference voltage and a local voltage source (for example local ground or a local power supply voltage).

SUMMARY

According to the teachings of the present embodiment there is provided, a system for providing a local reference voltage, the system including: a first master reference voltage line; a second master reference voltage line oriented spatially parallel to the first master reference voltage line; a single central master reference voltage source operationally connected to the first master reference voltage line and operationally connected to the second master reference voltage line, the single central master reference voltage source configured to provide a differential reference voltage; a local voltage source configured to provide a local voltage; and a local reference voltage generator operationally connected to the first master reference voltage line and operationally connected to the second master reference voltage line, configured to generate a local reference voltage referred to the local voltage and substantially proportional to the differential reference voltage; wherein the single central master reference voltage source is further configured to distribute accurately the differential reference voltage using the first master reference voltage line with the second master reference voltage line.

In an optional embodiment, the system of further includes: a plurality of local reference voltage generators; and a plurality of sets of branch conductors, each of the sets of branch conductors including a branch of the first master reference voltage line oriented spatially parallel to a branch of the second master reference voltage line and configured to distribute accurately the differential reference voltage to the plurality of local reference voltage generators.

In another optional embodiment, in the local reference voltage generator, a first current substantially proportional to the voltage difference between the two master voltages passes through a first resistor, and wherein a second current substantially proportional to a voltage difference across the first resistor passes through a resistive network having a first terminal connected to the local voltage and wherein the local reference voltage is present at a second terminal of the resistive network.

In another optional embodiment, the local reference voltage generator includes: a second resistor; a first field effect transistor; a second field effect transistor; a first negative feedback amplifier operative to drive the first field effect transistor so as to impress a voltage substantially equal to the first master reference voltage upon a first terminal of the second resistor; and second negative feedback amplifier operative to drive the second field effect transistor so as to impress a voltage substantially equal to the second master reference voltage upon a second terminal of the second resistor, and wherein the first current flows through the second resistor.

In another optional embodiment, at least one of the plurality of local reference voltage generators further includes: a field effect transistor; and a negative feedback amplifier operative to drive the field effect transistor so as to cause a current substantially proportional to the voltage difference across the first resistor to flow through the resistive network. In another optional embodiment, the system is implemented on an integrated circuit die. In another optional embodiment, the system further includes at least two resistors configured as a voltage divider that is operative to impress a voltage proportional to a master reference voltage upon one of the master reference voltage lines. In another optional embodiment, the master reference voltage is obtained from a bandgap reference voltage source.

According to the teachings of the present embodiment there is provided, a method of providing a local reference voltage, including the steps of: using a single central master reference voltage source to provide a differential reference voltage; distributing accurately the reference voltage via a first master reference voltage line and a second master reference voltage line that are spatially parallel to each other; and generating a local reference voltage referred to a local voltage and substantially proportional to the differential reference voltage.

In an optional embodiment, the method further includes distributing accurately the differential reference voltage via a plurality of sets of branch conductors to a plurality of local reference voltage generators, each of the sets of branch conductors including a branch of the first master reference voltage line oriented spatially parallel to a branch of the second master reference voltage line.

BRIEF DESCRIPTION OF FIGURES

The embodiment is herein described, by way of example only, with reference to the accompanying drawings, wherein.

DETAILED DESCRIPTION

The principles and operation of the system and method according to the present embodiment may be better understood with reference to the drawings and the accompanying description. The present embodiment is a system and method for accurately distributing a master reference voltage to a plurality of local circuits within a system. The system distributes a central master reference voltage accurately to a plurality of local circuits as a difference in the voltage of a pair of conductors orientated substantially spatially parallel. The system and method also facilitates generating local reference voltages based on the master reference voltage and a local voltage source. Implementations of this system and method commonly achieve accuracy better than 1 millivolt in local reference voltages generated based on a master reference voltage.

Figure 1:
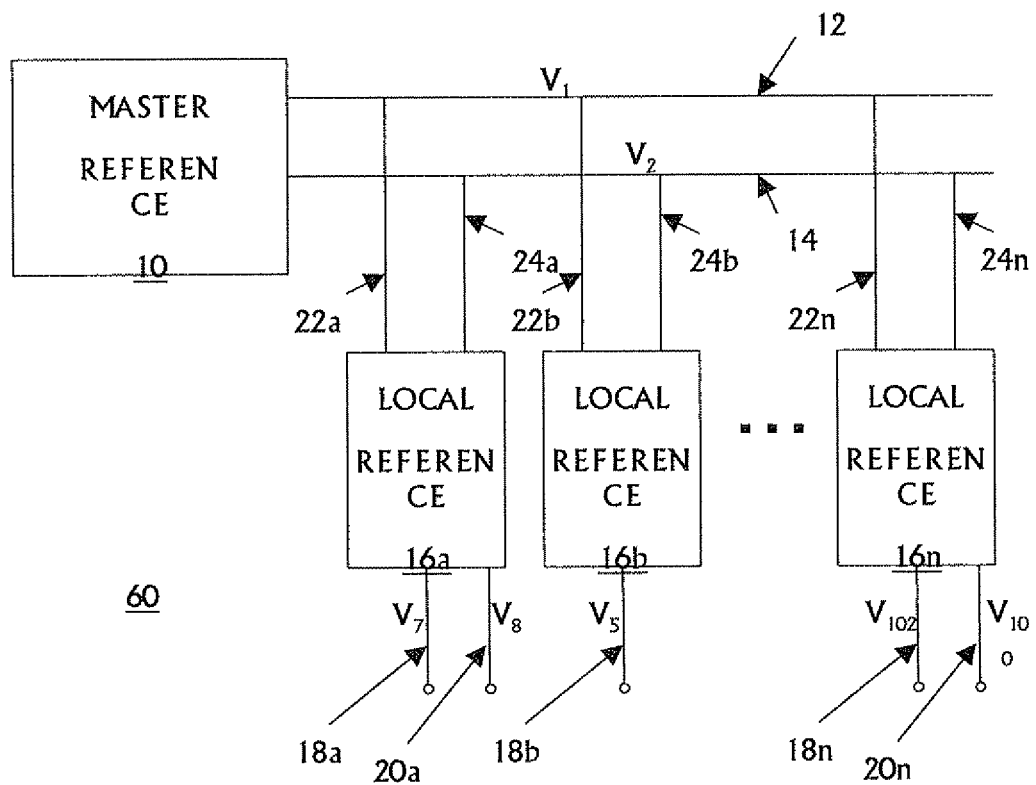
FIG. 1 is a schematic diagram of a system for accurately distributing a central master reference voltage to a plurality of local circuits.

Referring now to the drawings, FIG. 1 is a schematic diagram of a system for accurately distributing a central master reference voltage to a plurality of local circuits. A single central master reference voltage source 10 (also referred to simply as the "master reference") is operationally connected to a first master reference voltage conductor 12 and operationally connected to a second master reference voltage conductor 14. The master reference 10 is configured to impresses a first master reference voltage $V_1$ on first master reference conductor 12 and to impress a second master reference voltage $V_2$ on second master reference conductor 14, thereby providing a differential reference voltage. The differential reference voltage is distributed using master conductors 12 and 14 that are oriented spatially parallel to each other, thereby providing accurate distribution of the differential reference voltage. Conductors 12 and 14 each branch into respective sets of branch conductors 22a-22n and 24a-24n, which supply master reference voltages $V_1$ and $V_2$ to an arbitrary number of local reference voltage generators 16a-16n.

Local reference voltage generators 16a-16n include a local voltage source (not shown), and are configured to generate a local reference voltage referred to the local voltage and substantially proportional to the differential reference voltage. The feature of generating local reference voltages referred to local voltages and substantially proportional to the differential reference voltage facilitates generation of accurate local reference voltages. The specific local reference voltages generated depend on the specific application. In one non-limiting example, local reference voltage generator 16a provides a first local reference voltage $V_7$ on first local reference voltage conductor 18a and a second local reference voltage $V_8$ on second local reference voltage conductor 20a. In another non-limiting example, local reference voltage generator 16b provides local reference voltage $V_5$ on local reference voltage conductor 18b. In another non-limiting example, local reference voltage generator 16n provides a first local reference voltage $V_{102}$ on first local reference voltage conductor 18n and a second local reference voltage $V_{100}$ on second local reference voltage conductor 20n.

Depending on the application, master conductors 12 and 14 and branch conductors 22a-22n can be configured in a variety of spatially parallel orientations. General spatially parallel orientations include, but are not limited to the conductors being side-by-side in parallel lines, with one conductor above, beside, or below the other conductor. In this context, parallel refers to the conductors extending in the same direction, substantially equidistant at all points, and neither converging or diverging from each other. In an implementation where the circuit is constructed with discrete components, the conductors can be twisted around each other. In an implementation on an integrated circuit, the conductor traces can be laid out in parallel routes. The spatially parallel orientation of the master and branch conductors reduces, or in some cases eliminates, errors in the differential reference voltage at least in part because sources of voltage errors generally effect both conductors substantially equally, hence producing substantially equal disturbances in each conductor, and the difference in voltages between the conductors is substantially unchanged. As stated above, sources of voltage errors include, but are not limited to, electrical and magnetic coupling inductively and/or capacitively from voltages in the circuit to the reference voltage conductors. As also stated above, the feature of generating local reference voltages referred to local voltages and substantially proportional to the differential reference voltage facilitates generation of accurate local reference voltages.

The number of sets of branch conductors ($22a$-$22n$ and $24a$-$24n$), and corresponding local reference voltage generators $16a$-$16n$, depends on the application. Although implementation of this system and method facilitate an arbitrary number of local reference voltage generators, the specific number will be limited by practical considerations of the specific application.

In the following description, a preferred embodiment on an integrated circuit die is used for components, to assist in examples and explanations. As stated above, other embodiments are possible. An example of one alternative embodiment is implementation of this system using discrete components. Throughout the description below, parts such as resistors, FETs, operational amplifiers, and conductors are used. All of these parts are available as discrete components. For example, an alternative embodiment of the implementation of this system is to use a differential conductive pair wire, such as twin-axial wire, to differentially distribute the reference voltages. In addition, the connection and placement of connectors and conductors can be done with discrete components in alternative embodiments.

Figure 2:
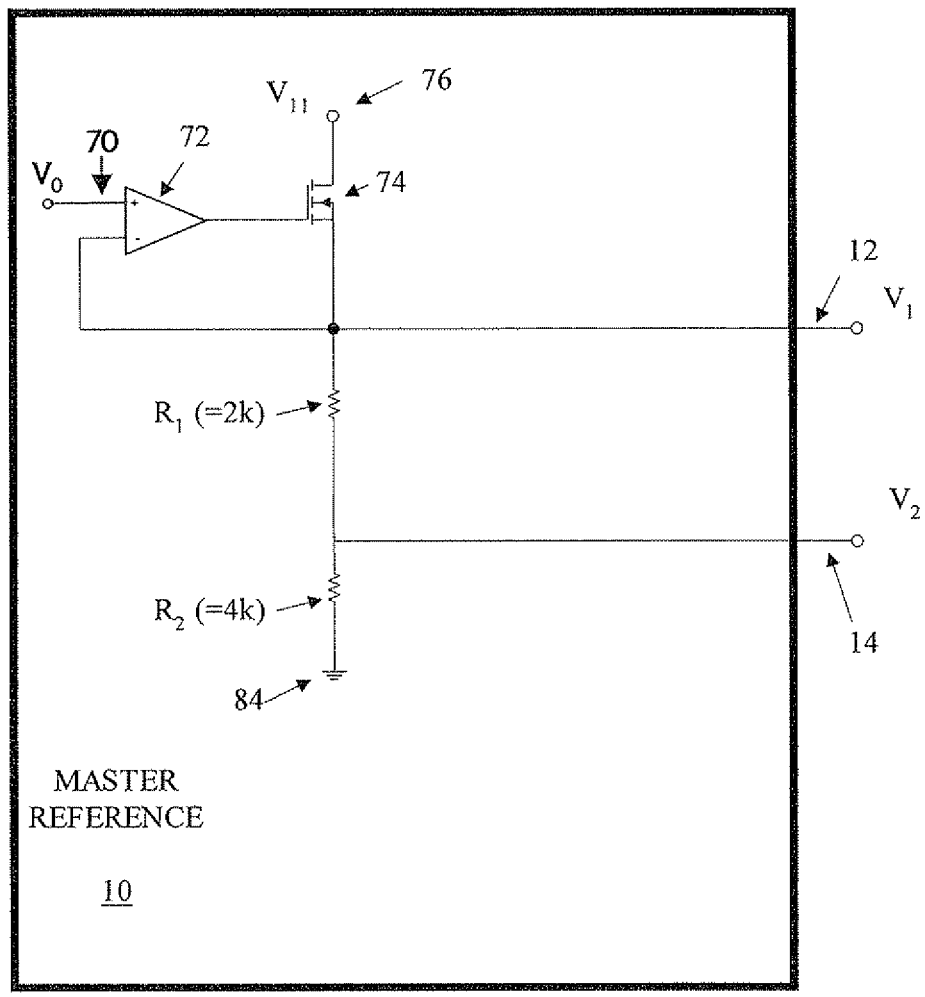
FIG. 2, a schematic diagram of one implementation of a single central master reference voltage source.

Referring now to FIG. 2, this FIGURE is a schematic diagram of one exemplary implementation of a single central master reference voltage source (master reference 10). Master reference 10 can be provided by a variety of known circuits depending on the application. While the following description of FIG. 2 provides one implementation, based on the description in this document one skilled in the art will be able to select an implementation appropriate for the application.

A reference voltage $V_0$ is provided by a reference source (not shown) such as a bandgap reference voltage generator, via a conductor 70 at the positive input of differential amplifier 72. The output of amplifier 72 drives the gate of a field effect transistor (FET) 74. The drain of FET 74 is connected to a power supply terminal 76 and the source of FET 74 is connected to two series-connected resistors $R_1$ and $R_2$. The source of FET 74 is also connected to the negative input of amplifier 72.

It will be readily apparent to those trained in the art that the above-described negative-feedback configuration of amplifier 72 causes the voltage $V_1$ at first master reference conductor 12 to be substantially equal to the reference voltage $V_0$ on conductor 70:

$$V_1=V_0.$$

It will also be readily apparent that, if the current through second master reference conductor 14 is negligibly small, the voltage $V_2$ at conductor 14 is substantially equal to the reference voltage $V_0$ on conductor 70 multiplied by the quotient of $R_2$ and the sum of $R_1$ and $R_2$:

$$V_2=V_0(R_2/(R_1+R_2)).$$

It will furthermore be readily apparent that the voltage difference, $V_1$-$V_2$, between conductors 12 and 14 is substantially equal to the reference voltage $V_0$ on conductor 70 multiplied by the quotient of $R_1$ and the sum of $R_1$ and $R_2$:

$$V_1-V_2=V_0(R_1/(R_1+R_2)).$$

Conductors 12 and 14 supply the differential voltage reference distribution network seen in FIG. 1.

Figure 3:
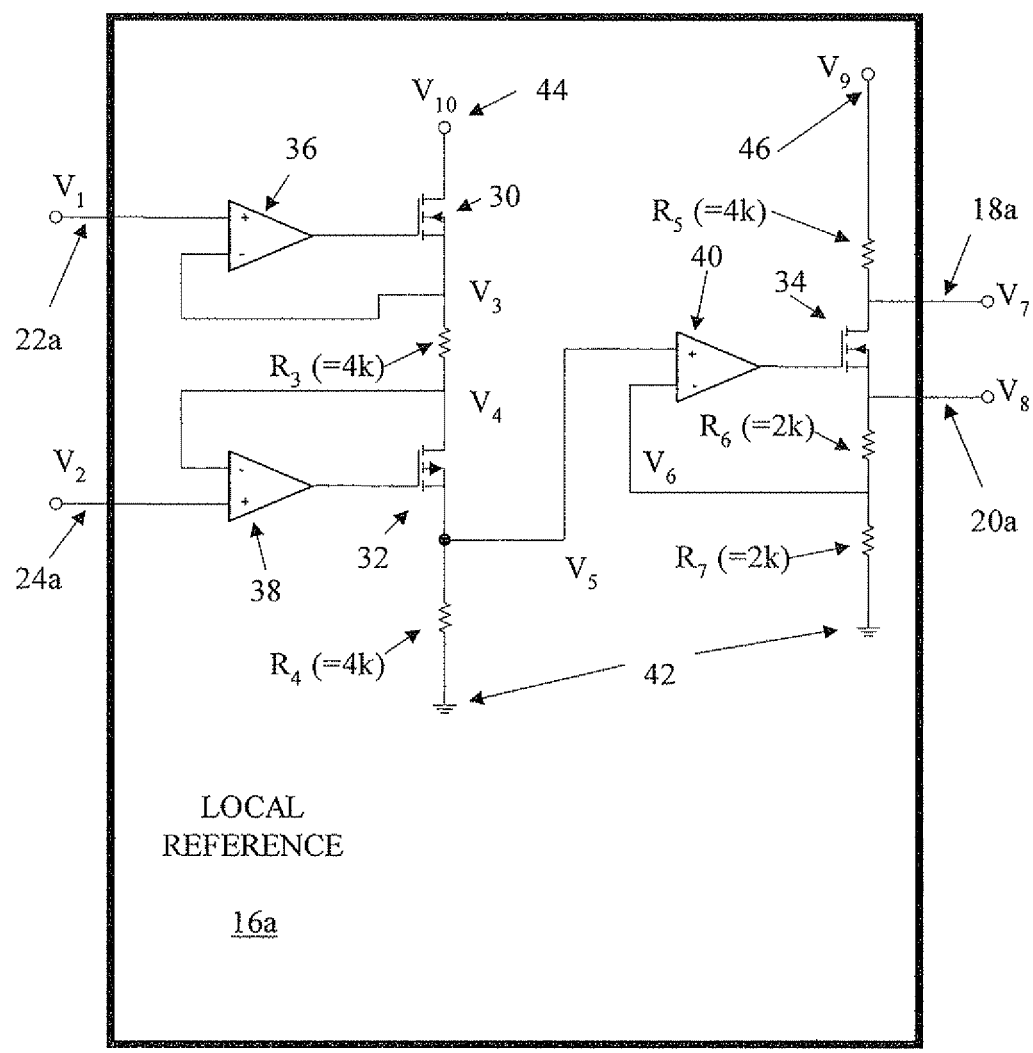
FIG. 3, a schematic diagram of one implementation of a local reference voltage generator.

Referring now to FIG. 3, this FIGURE is a schematic diagram of one exemplary implementation of a local reference voltage generator (e.g. local reference $16a$). Local reference $16a$ can be provided by a variety of known circuits depending on the application. Other implementations are possible, and reference generators using a differential input are known in the art. Examples include U.S. Pat. No. 6,965,337 to Jishnu Bhattacharjee et al, titled Reference generator. While the following description of FIG. 3 provides one implementation, based on the description in this document one skilled in the art will be able to select an implementation appropriate for the application.

A feature of this system and method for accurately distributing a master reference voltage to a plurality of local circuits within a system is facilitating the generation of local reference voltages referred to a local voltage source. A local reference voltage generator includes a local voltage source, and is configured to generate a local reference voltage referred to the local voltage and substantially proportional to the differential reference voltage. The below-described implementation is a popular case where the local reference voltage is generated referred to a local ground 42 and a locally supplied voltage $V_{10}$ at terminal 44. In another implementation, local ground 42 is replaced with a locally supplied voltage, and the local reference voltage is generated referred to the locally supplied voltage.

In local reference voltage generator ($16a$), a first current substantially proportional to the voltage difference between a first master reference voltage ($V_1$) and a second master reference voltage ($V_2$) passes through a first resistor (e.g. $R_4$), and a second current substantially proportional to, a voltage difference across the first resistor (e.g. $R_4$) passes through a resistive network (e.g. $R_5$, $R_6$, $R_7$) having a first terminal (e.g. terminal 42 of FIG. 3 shown connected to local ground, serves as the reference) connected to a local voltage (e.g. local voltage $V_9$ on line 46), and wherein the local reference voltage (e.g. $V_8$ or $V_7$) is present at a second terminal (e.g. $20a$ or $18a$) of the resistive network. In another optional implementation, the resistive network (e.g. $R_5$, $R_6$, $R_7$) having a first terminal (e.g. terminal 42 serves as the reference) connected to the local voltage (e.g. local voltage $V_9$ on line 46), and wherein the local reference voltage (e.g. $V_8$ or $V_7$) is present at a second terminal (e.g. $20a$ or $18a$) of the resistive network. For example, a first current substantially proportional to the voltage difference between the two master voltages $V_1$ and $V_2$ passes through resistor $R_4$, and a second current substantially proportional to the voltage difference across resistor $R_4$ passes through the resistive network including $R_5$, $R_6$, and $R_7$. The voltage $V_7$ on conductor $18a$ would then be a local reference voltage with respect to the local voltage $V_9$ on conductor 46, and the voltage $V_8$ on conductor $20a$ would be a second local reference voltage, this second local reference voltage being with respect to the local ground voltage 42.

Local reference voltage generator (16a) includes: (a) a second resistor (e.g. $R_3$); (b) a first field effect transistor (e.g. 30); (c) a second field effect transistor (e.g. 32); (d) a first negative feedback amplifier (e.g. 36) operative to drive the first field effect transistor (30) so as to impress a voltage (e.g. $V_3$) substantially equal to the first master reference voltage ($V_i$) upon a first terminal of second resistor (e.g. $R_3$), and (e) a second negative feedback amplifier (e.g. 38) operative to drive the second field effect transistor (e.g. 32) so as to impress a voltage (e.g. $V_4$) substantially equal to the second master reference voltage ($V_2$) upon a second terminal of the second resistor, and wherein the first current flows through the second resistor.

The local reference voltage generator also includes: (a) a field effect transistor (e.g. 34); and (b) a negative feedback amplifier (e.g. 40) operative to drive the field effect transistor so as to cause a current substantially proportional to the voltage difference across the first resistor (e.g. $R_4$) to flow through the resistive network (e.g. $R_5$, $R_6$, $R_7$).

A branch 22a of the first master reference conductor (12 in FIG. 1) is connected to the positive input of differential amplifier 36. The output of amplifier 36 drives the gate of NMOS FET 30. The drain of NMOS FET 30 is connected to a terminal 44 of a first local power supply and the source of NMOS PET 30 is connected to a first terminal of resistor $R_3$. The source of NMOS FET 30 is also connected to the negative input of amplifier 36.

It will be readily apparent to those trained in the art that the above-described negative-feedback configuration of amplifier 36 causes voltage $V_3$ at the first terminal of resistor $R_3$ to be substantially equal to first master reference voltage $V_1$ on branch 22a:

$V_3 = V_1$.

A branch 24a of the second master reference conductor (14 in FIG. 1) is connected to the positive input of differential amplifier 38. The output of amplifier 38 drives the gate of PMOS FET 32. The drain of PMOS FET 32 is connected to a second terminal of resistor $R_3$ and the source of PMOS FET 32 is connected to a first terminal of resistor $R_4$ and to the positive input of differential amplifier 40. A second terminal of resistor $R_4$ is connected to a local ground 42. The drain of PMOS FET 32 is also connected to the negative input of amplifier 38.

It will be readily apparent to those trained in the art that amplifier 38 is in a negative feedback configuration. Using a PMOS transistor in amplifier 38 (the lower op-amp) instead of an NMOS transistor, provides better phase margins (better stability of the loop). The above-described negative-feedback configuration of amplifier 38 causes the voltage $V_4$ at the second terminal of resistor $R_3$ to be substantially equal to the second master reference voltage $V_2$ on branch 24a:

$V_4 = V_2$.

It will also be readily apparent to those trained in the art that the voltage difference across resistor $R_3$ causes a current proportional to this voltage difference, $V_3 - V_4$, to flow through resistor $R_3$.

It will be further apparent that, if the current at the negative input of amplifier 38, the current at the positive input of amplifier 40, and the gate leakage current of PMOS FET 32 are all negligible, then the current through resistor $R_4$ is substantially equal to the current through resistor $R_3$, and that the voltage $V_5$ at the positive input of amplifier 40 therefore is substantially equal to the voltage difference $V_2 - V_1$ between branches 22a and 24a multiplied by the quotient of the resistances of resistors $R_4$ and $R_3$:

$V_5 = (V_2 - V_1)(R_4/R_3)$

The output of amplifier 40 drives the gate of NMOS FET 34. The drain of NMOS FET 34 is connected to a first terminal of resistor $R_5$ and to first local reference voltage conductor 18a. A second terminal of resistor $R_5$ is connected to terminal 46 of a second local power supply. The source of NMOS FET 34 is connected to a first terminal of resistor $R_6$ and to a second local reference voltage conductor 20a. A second terminal of resistor $R_6$ is connected to a first terminal of a resistor $R_7$ and to the negative input of amplifier 40. A second terminal of resistor $R_7$ is connected to local ground 42.

It will be readily apparent to those skilled in the art that the negative-feedback configuration of amplifier 40 causes the voltage $V_6$ at the junction of resistors $R_6$ and $R_7$ to be substantially equal to the voltage $V_5$ at the positive input of amplifier 40:

$V_6 = V_5$.

Therefore, if the current at the negative input of amplifier 40 is negligible, the voltage $V_8$ at second local reference voltage conductor 20a, relative to local ground 42, is substantially equal to the voltage $V_6$ at the junction of resistors $R_6$ and $R_7$ times the quotient of the sum of resistors $R_6$ and $R_7$ and resistor $R_7$:

$V_8 = V_6(R_6 + R_7)/R_7$.

Furthermore, if the input current of amplifier 40, the gate leakage of NMOS FET 34, and the currents through conductors 18a and 20a are all negligible, the current through resistor $R_5$ is substantially equal to the current through resistor $R_7$, and therefore the voltage $V_7$ at first local reference voltage conductor 18a is substantially equal to the voltage $V_9$ at terminal 46 minus the product of the voltage $V_6$ across resistor $R_7$ and the quotient of resistors $R_5$ and $R_7$:

$V_7 = V_9 - V_6(R_5/R_7)$.

Thus, this embodiment provides local reference voltages referenced to a local ground and/or a local power supply voltage, and proportional to a reference voltage distributed as a differential pair.

As a non-limiting numerical example, the values of the resistors in the embodiment described above are set as follows (these values are shown in FIG. 2 and FIG. 3):

Resistors $R_1$, $R_6$ and $R_7$ are each 2 k.

Resistors $R_2$, $R_3$, $R_4$, and $R_5$ are each 4 k.

It is to be noted that the absolute values of the individual resistors are not as important as the ratios between the resistors. Common practice, when the ratios of resistors fabricated on integrated circuits are of critical importance, is to fabricate those resistors using series and/or parallel combinations of identical resistors fabricated spatially close together. For example, if the desire is to have two resistors in a precise ratio of 1:2, the first resistor can be fabricated as a 5 k resistor, while the second resistor can be fabricated as two 5 k resistors in series, to form a 10 k resistor. Preferably, all three resistors are fabricated in close spatial proximity to each other, so that the effects of variations in process parameters over the surface of the integrated circuit on the relative values of the various resistors are minimized. Accordingly, the use of series and/or parallel combinations of resistors to produce desired ratios of resistances is preferred in an IC implementation. For simplicity, the use of this technique is not shown in the figures. The production of the required resistances and resistance ratios by any technique is within the scope of the present system.

Also, in this example, primary reference voltage $V_0$ on conductor 70 is 1.2V, the voltage $V_{11}$ at terminal 76 is 2.0V, the voltage $V_{10}$ at terminal 44 is 2.0V, and the voltage $V_9$ at terminal 46 is 2.0V.

Given the above values, the voltage $V_1$ on conductor 12, and therefore that on branch 22a, is 1.2V. The voltage $V_2$ on branch 14, and therefore that on branch 24a, is 0.8V. The voltage $V_3-V_4$ across resistor $R_3$ is 1.2V−0.8V=0.4V and the current through resistors $R_3$ and $R_4$ is 0.4V/4 k=0.1 mA. Thus, the voltage $V_5$, relative to local ground, at the positive input of amplifier 40, and the voltage $V_6$ at the junction of resistors $R_6$ and $R_7$, are both (0.1 mA)(4 k)=0.4V, and the current through resistors $R_5$, $R_6$ and $R_7$ is 0.4V/2 k=0.2 mA.

Therefore, the voltage $V_7$ at first local voltage reference 18a is 2.0V−((0.2 mA)(4 k)), i.e., 1.2V, and the voltage $V_8$ at second local voltage reference 20a is (0.2 mA)(2 k+2 k), i.e., 0.8V. Note that $V_7$ is referenced to $V_9$, i.e., $V_7$ follows variations in $V_9$ such that $V_7$ is always 0.8V less than $V_9$. Similarly, $V_8$ is referenced to local ground 42, i.e., $V_8$ follows variations in local ground 42 such that $V_8$ is always 0.8V greater than local ground 42.

Note that resistors $R_3$ need not all have the same values in all the local reference voltage generators 16, and similarly for the other resistors $R_4$ through $R_7$. Each local reference voltage generator's resistances are selected according to the local voltage that that local reference voltage generator is intended to supply.

The above-described implementation of a local reference voltage generator provides two voltage outputs, $V_7$ on conductor 18a and $V_8$ on conductor 20a. In a case where a single-ended local reference voltage is required, such as FIG. 1 block 16b, voltage $V_5$ can be output as FIG. 1 voltage $V_5$ on conductor 18b.

It will be appreciated that the above descriptions are intended only to serve as examples, and that many other embodiments are possible within the scope of the present invention as defined in the appended claims.

What is claimed is:

1. A system for providing a local reference voltage, the system comprising:
    (a) a first master reference voltage line;
    (b) a second master reference voltage line oriented spatially parallel to said first master reference voltage line;
    (c) a single central master differential reference voltage source operationally connected to said first master reference voltage line and operationally connected to said second master reference voltage line, driven by a power supply terminal, and configured to provide a differential reference voltage;
    (d) a local voltage source supply configured to provide a local voltage; and
    (e) a local reference voltage generator operationally connected to said first master reference voltage line, operationally connected to said second master reference voltage line, driven by a first local power supply, and configured to generate a local reference voltage referred to said local voltage and substantially proportional to said differential reference voltage;
    wherein said single central master differential reference voltage source is further configured to distribute accurately said differential reference voltage using said first master reference voltage line with said second master reference voltage line for spatially parallel differential distribution, and
    wherein at least one of the supplies is different from at least one other of the supplies.

2. The system of claim 1 further comprising:
    (a) a plurality of local reference voltage generators; and
    (b) a plurality of sets of branch conductors, each of said sets of branch conductors including a branch of said first master reference voltage line oriented spatially parallel to a branch of said second master reference voltage line and configured to distribute accurately said differential reference voltage to said plurality of local reference voltage generators.

3. The system of claim 1 wherein, in said local reference voltage generator, a first current substantially proportional to said voltage difference between said two master voltages passes through a first resistor, and wherein a second current substantially proportional to a voltage difference across said first resistor passes through a resistive network having a first terminal connected to said local voltage and wherein said local reference voltage is present at a second terminal of said resistive network.

4. The system of claim 2 wherein said local reference voltage generator comprises:
    (a) a second resistor;
    (b) a first field effect transistor;
    (c) a second field effect transistor;
    (d) a first negative feedback amplifier operative to drive said first field effect transistor so as to impress a voltage substantially equal to said first master reference voltage upon a first terminal of said second resistor; and
    (e) a second negative feedback amplifier operative to drive said second field effect transistor so as to impress a voltage substantially equal to said second master reference voltage upon a second terminal of said second resistor, and wherein said first current flows through said second resistor.

5. The system of claim 2 wherein at least one of said plurality of local reference voltage generators further comprises:
    (a) a field effect transistor; and
    (b) a negative feedback amplifier operative to drive said field effect transistor so as to cause a current substantially proportional to said voltage difference across said first resistor to flow through said resistive network.

6. The system of claim 1 wherein the system is implemented on an integrated circuit die.

7. The system of claim 1 wherein the system further comprises at least two resistors configured as a voltage divider that is operative to impress a voltage proportional to a master reference voltage upon one of the master reference voltage lines.

8. The system of claim 7 wherein said master reference voltage is obtained from a bandgap reference voltage source.

9. A method of providing a local reference voltage, comprising the steps of:
    (a) using a single central master differential reference voltage source driven by a power supply terminal to provide a differential reference voltage;
    (b) distributing accurately said reference voltage via a first master reference voltage line and a second master reference voltage line that are spatially parallel to each other; and
    (c) generating a local reference voltage referred to a local voltage and substantially proportional to said differential reference voltage said generating driven by a first local power supply
    wherein at least one of the supplies is different from at least one other of the supplies.

10. The method of claim 9 wherein said method further comprises distributing accurately said differential reference voltage via a plurality of sets of branch conductors to a plurality of local reference voltage generators, each of said sets of branch conductors including a branch of said first master reference voltage line oriented spatially parallel to a branch of said second master reference voltage line.

* * * * *